United States Patent
DeVries et al.

(10) Patent No.: US 7,399,944 B2
(45) Date of Patent: Jul. 15, 2008

(54) METHOD AND ARRANGEMENT FOR CONTROLLING A GLOW DISCHARGE PLASMA UNDER ATMOSPHERIC CONDITIONS

(75) Inventors: Hindrik Willem DeVries, Tilburg (NL); Yoichiro Kamiyama, Tilburg (NL); Jan Bastiaan Bouwstra, Bilthoven (NL); Mauritius Cornelius Maria Van de Sanden, Tilburg (NL); Eugen Aldea, Eindhoven (NL); Paul Peeters, Eindhoven (NL)

(73) Assignee: Fuji Photo Film B.V. (NL)

( * ) Notice: Subject to any disclaimer, the term of this patent is extended or adjusted under 35 U.S.C. 154(b) by 185 days.

(21) Appl. No.: 11/202,366

(22) Filed: Aug. 12, 2005

(65) Prior Publication Data
US 2006/0081566 A1 Apr. 20, 2006

(30) Foreign Application Priority Data
Aug. 13, 2004 (EP) .................... 04077286

(51) Int. Cl.
*B23K 10/00* (2006.01)
(52) U.S. Cl. ............ 219/121.48; 219/121.57; 219/121.54; 219/121.43; 315/111.51
(58) Field of Classification Search ............ 219/121.36, 219/121.48, 121.54, 121.57; 315/111.21, 315/111.31, 111.41, 111.51, 111.81, 111.91; 313/231.31, 231.41
See application file for complete search history.

(56) References Cited

U.S. PATENT DOCUMENTS

| | | | | | |
|---|---|---|---|---|---|
| 4,877,999 A | * | 10/1989 | Knapp et al. | ................. | 315/248 |
| 5,095,247 A | * | 3/1992 | Hanamura | ............. | 315/111.21 |
| 5,414,324 A | * | 5/1995 | Roth et al. | ............. | 315/111.21 |
| 5,968,377 A | * | 10/1999 | Yuasa et al. | ............ | 219/121.41 |
| 6,046,546 A | * | 4/2000 | Porter et al. | ........... | 315/111.21 |
| 2001/0001435 A1 | | 5/2001 | Slone et al. | | |

FOREIGN PATENT DOCUMENTS

| | | |
|---|---|---|
| EP | 1381257 | 1/2004 |
| EP | 1403902 | 3/2004 |
| JP | 10247072 | 9/1998 |
| KR | 2002018902 | 3/2002 |

OTHER PUBLICATIONS

Bletzinger, P. et al. "The Effect of Displacement Current on Fast-Pulsed Dielectric Barrier Discharges" Journal of Physics D (Applied Physics) IOP Publishing UK. vol. 36, No. 13. pp. 1550-1552.
Database WPI, Section PQ, Week 200265, Derwent Publications Ltd., London, GB; Mar. 9, 2002.
Patent Abstracts of Japan, vol. 1998, No. 14; Dec. 31, 1998.

* cited by examiner

*Primary Examiner*—Mark Paschall
(74) *Attorney, Agent, or Firm*—Davidson Berquist Jackson & Gowdey LLP

(57) ABSTRACT

The present invention is directed to a method and arrangement for controlling a glow discharge plasma in a gas or gas mixture under atmospheric conditions, in a plasma discharge space comprising at least two spaced electrodes in which at least one plasma pulse having an absolute pulse maximum is generated by applying an AC plasma energizing voltage to the electrodes causing a plasma current and a displacement current. The plasma is controlled by providing a relative decrease of the displacement current after the pulse maximum. In a preferred embodiment, the energizing voltage is applied through a series circuit including a choke coil and a non-saturable inductor.

44 Claims, 3 Drawing Sheets

METHOD AND ARRANGEMENT FOR CONTROLLING A GLOW DISCHARGE PLASMA UNDER ATMOSPHERIC CONDITIONS

FIELD OF THE INVENTION

The present invention relates generally to a method and an arrangement for controlling a glow discharge plasma and, more specifically, to a method and an arrangement for controlling a glow discharge plasma in a gas or gas mixture under atmospheric conditions.

BACKGROUND OF THE INVENTION

Atmospheric Pressure Glow (APG) discharge is used in practice, among others, for non-destructive material surface modification. Glow discharge plasmas are relatively low power density plasmas, typically generated under atmospheric pressure conditions or partial vacuum environments.

Most commonly, the plasma is generated in a plasma chamber or plasma discharge space between two oppositely arranged parallel plate electrodes. However, the plasma may also be generated using other electrode configurations such as, for example, adjacently arranged electrodes. The plasma is generated in a gas or a gas mixture by energizing the electrodes from AC power supply means.

It has been observed that a stable and uniform plasma can be generated in, for example, a pure Helium or a pure Nitrogen gas. However, as soon as impurities or other gasses or chemical compositions at ppm level are present in the gas, the stability of the plasma will decrease significantly. Typical examples of stability destroying components are $O_2$, NO, $CO_2$, etc.

Instabilities in the plasma will either develop in a high current density plasma or will extinguish the plasma locally. With a large density of species and a high frequency of collisions in the plasma, an APG shows a fast positive feedback. That is, a random local increase of the ionization of the plasma will exponentially increase. Accordingly, an instability will develop either in a high current density plasma or will extinguish locally the plasma. This phenomenon of exponential increase of the plasma current is known as glow to arc transition. As a result, current arcing occurs and the glow discharge plasma can not be maintained. Instead, a combination of filamentary and glow discharge is generated.

Filamentary discharge between parallel plate electrodes in air under atmospheric pressure has been used to generate ozone in large quantities. However, filamentary discharge is of limited use for surface treatment of materials, since the plasma filaments tend to puncture or treat the surface unevenly and are associated with relatively high plasma current densities.

Although instabilities may occur at any time during generation of a plasma, it has been observed that the circumstances at the end of a plasma pulse (e.g. generated using an AC voltage) are beneficial to the occurrence and development of instabilities. At the end of the plasma pulse, the plasma current is relatively low while the voltage applied by the AC power supply increases due to the fact that the AC power supply tends to recover from the main plasma pulse. The life cycle of the plasma is approaching cut off in this stage of the plasma and the plasma current will decrease sharply, after which small instabilities and plasma variations may occur. Under the influence of the increasing voltage resulting from the recovering AC power supply, these instabilities and plasma variations may easily develop in major plasma instabilities, such as streamer formation and glow to arc transition. These circumstances, relatively low and decreasing plasma current together with increasing voltage, make it at the same time difficult to suppress or eliminate the instabilities.

SUMMARY OF THE INVENTION

The present invention has for its object to provide a method and an arrangement for controlling a glow discharge plasma for preventing and eliminating instabilities of the plasma at the end of a plasma pulse.

These and other objects of the present invention are achieved by the present invention, in a first aspect thereof, in that there is provided a method for controlling a glow discharge plasma in a gas or gas mixture under atmospheric conditions, in a plasma discharge space comprising at least two spaced electrodes, wherein at least one plasma pulse is generated by applying an AC plasma energizing voltage to the electrodes causing a plasma current and a displacement current, the at least one plasma pulse comprises an absolute pulse maximum, characterized in that the method comprises the step of controlling the energizing voltage such that a relative decrease of the displacement current is provided after the pulse maximum.

It has been observed to be of great importance to be able to control the plasma at the end of the plasma pulse, i.e. after the pulse maximum, since the plasma is particular unstable at that time. According to the invention, the plasma can be effectively controlled and instabilities in the plasma can be efficiently suppressed and eliminated at this stage of its existence, by providing a negative displacement current.

Plasma instabilities may either give rise to local extinguishing of the plasma, causing a relative decrease of the plasma current which is not in proportion to the regular relative decrease of the plasma current of the main pulse, or to filament formation, streamers; giving rise to (local) sharp increases of the plasma current.

Since filament formation is often the most damaging phenomenon in, for example, surface treatment methods such as chemical vapour deposition and treatment of polymer films for photo film industry, the effective suppression of filament formation by the present invention improves the quality and applicability of the method greatly.

As we are dealing with an alternating energizing voltage, the sign of the amplitude thereof, and also of the displacement current, will change from positive to negative and back. In the case of the positive half cycle or period of the energizing voltage, a decrease of the displacement current will reduce the probability of filament formation. Consequently one can prevent the generation of the filaments at the end of the plasma pulse by decreasing the displacement current at this stage of the plasma pulse, i.e. after the pulse maximum, in accordance with the present invention.

In the case of the negative half cycle of the energizing voltage a similar explanation, but with opposite signs as mentioned above, is valid.

Unless it is mentioned otherwise below, the description of the processes and/or measures to stabilize the glow plasma in accordance with the invention is mainly provided for the positive half cycle of the displacement current. An identical description for the negative half cycle of the displacement current can be equally provided by changing the signs to the opposite.

According to an embodiment of the present invention, the method further comprises a step of synchronizing the relative decrease of the displacement current and the plasma pulse after the pulse maximum.

If the relative decrease of the displacement current is provided too early, the main plasma pulse may be extinguished while it may still be productive in, for example, a surface treatment process. If, on the other hand, the relative decrease of the displacement current is provided too late, plasma instabilities still have an opportunity to be created. Timing is therefore to some extend important, and by synchronising the relative decrease of the displacement current in accordance with this embodiment of the invention, the quality and efficiency of the method can be effectively improved.

An example of the above may include synchronizing of the relative decrease with the occurrence of plasma variations, such as providing the decrease of the displacement current in response to one or more relative increases of the plasma current.

According to another embodiment of the present invention, the displacement current is controlled by controlling the plasma energizing voltage. Manipulation of the energizing voltage, in combination with suitable electronic circuitry, will enable manipulation of the displacement current. In particular, and in accordance with another embodiment of the invention, the relative decrease of the displacement current is provided by a relative decrease of the plasma energizing voltage.

According to yet another embodiment of the present invention, the energizing voltage is shaped, such that the displacement current substantially comprises a triangular waveform. In this case, the AC voltage may be shaped such that the displacement current shows a relative decrease during the whole of the period of the plasma occurrence, from before the plasma pulse starts, at the start of the plasma pulse, after the pulse maximum, and until the plasma is fully extinguished. It has been observed that the stability of the plasma is enhanced by steepening the slope of the displacement current, i.e. $dI_d/dt$. Preferably, the slope of the displacement current is shaped such that it is maximised from before plasma breakdown until after the plasma pulse is extinguished, for providing an as optimum as possible plasma stability.

According to another embodiment of the present invention, the plasma energizing voltage is applied at the electrodes via at least one non-linear element. Non-linear behaviour of electronic elements may beneficially be used to perform the steps of the present invention, such as to provide the relative decrease of the-displacement current and/or for controlling the energizing voltage.

According to another embodiment of the present invention, the non-linear element comprises at least one choke coil.

It will be appreciated that a choke coil can be used as a non-linear element. A choke coil can be easily installed in a number of configurations, and is relatively cheap and readily available.

A possible use of a choke coil with the method of the present invention, and in accordance with an embodiment thereof, is the operation of the choke coil in a basically saturated state during the plasma pulse and after the pulse maximum. In particular, one may think of providing the relative decrease of the displacement current by operating the choke coil such that the inductance of the choke coil behaves non-linear with respect to the plasma current.

It will be appreciated that the inductance of a saturated choke coil is much smaller than the inductance of an unsaturated choke coil. In its saturated state, a choke coil mainly operates as a resistance, whilst in an unsaturated state the choke coil behaves as a regular inductance, counteracting its change of flux. Near the saturation point, where the current through the coil is substantially equal to the saturation current, the inductance rapidly drops with increasing current through the coil, and the inductance shows a strong non-linear dependency on the current.

Assume a choke coil, connected in series with a pair of plasma electrodes, is operated in a saturated state when the plasma is generated using an AC voltage. Considering a positive half cycle of the AC voltage, directly after the plasma current has reached a maximum (pulse maximum) the plasma current will decrease again and as explained hereinbefore, the AC voltage will tend to increase as the AC power supply recovers from the main plasma pulse. As the decreasing current approaches the saturation point of the coil, near the saturation point the inductance of the coil will increase with decreasing current. As a result, the impedance of the coil will increase likewise with decreasing current and the voltage drop over the coil will increase. The increasing voltage drop is equivalent to a relative decrease of the displacement current. The choke coil seems to act as a negative resistance (increasing voltage drop over the APG electrode with decreasing current). As a result of the relative decrease of the displacement current, filament formation may effectively be suppressed in this phase of the plasma pulse.

In order to obtain a resonant circuit, besides the choke coil, an other inductor is arranged, for example, in series with the choke coil. This other inductor should have a higher inductance than the choke coil. In a resonant circuit, even after plasma ignition, the total current to the power supply will tend to remain in the same sine shape and value as without the plasma.

Voltage variations over time can be represented by:

$$CdV/dt = -I_{plasma} + I_0 \sin(\omega t + \phi) \qquad (1)$$

wherein:

$I_{plasma}$=plasma current, $I_0 \sin(\omega t+\phi)$=unperturbed sine current, V=plasma energizing voltage, t=time, ω=angular frequency of V φ=phase angle.

Accordingly, if the plasma current is small at the end of the plasma pulse life cycle, in comparison to the unperturbed current $I_0$, generation of a voltage drop for suppressing instabilities is almost impossible. This is the area that is covered using the saturated choke coil. Non-linearity of the choke coil with respect to current variations is, however, essential.

From the above, it will be appreciated that proper dimensioning of a choke coil also enables proper timing of the method of the present invention. The saturation properties of the choke coil may be controlled by changing the ferromagnetic properties and dimensions of the core. Timing of the method of the present invention may also be controlled by using e.g. phase shifting means, such as an impedance matching circuit, an inductance such as a choke coil, or other phase shifting means, in accordance with an embodiment of the invention.

Given the saturation current of a choke coil, which is the threshold current for which the choke coil becomes saturated, in accordance with a preferred embodiment, the ratio between the displacement current $I_d$ and the saturation current $I_{sat}$ is comprised in a range between 1.0 and 3.0 at least from just before the plasma breakdown until during the plasma pulse after the pulse maximum. In particular, the ratio between the displacement current and the saturation current is comprised in a range between 1.2 and 1.6 in that time period. It has been observed that the choke coil can be properly dimensioned with its saturation current within the above-mentioned ranges.

In accordance with a second aspect of the present invention, there is provided an arrangement for controlling a glow discharge plasma in a discharge space having at least two spaced electrodes, means for introducing in the discharge space a gas or gas mixture under atmospheric conditions, a power supply for energizing the electrodes by applying an AC plasma energizing voltage to the electrodes for generating at least one plasma pulse and causing a plasma current and a displacement current, the at least one plasma pulse comprising an absolute pulse maximum, and means for controlling the plasma, characterized in that, the means for controlling the plasma are arranged for controlling the energizing voltage such that a relative decrease of the displacement current is provided after the pulse maximum.

In a further embodiment of the arrangement of the invention, means for synchronizing the relative decrease of the displacement current and the plasma pulse after the pulse maximum are provided.

In a yet further embodiment of the arrangement of the invention, the means for controlling the plasma are arranged for controlling the displacement current by controlling the plasma energizing voltage.

In a still further embodiment of the arrangement of the invention, the means for controlling the plasma are arranged for providing the relative decrease of the displacement current by providing a relative decrease of the plasma energizing voltage.

In accordance with the invention, the means for controlling the plasma may be arranged for shaping the plasma energizing voltage, for example such that the displacement current substantially comprises a triangular waveform.

In accordance with one of the embodiments of the present invention, the arrangement comprises at least one non-linear element, which at least one non-linear element is connected in series between the electrodes and AC power supply terminals. The non-linear element may, for example, comprise a choke coil.

In a preferred embodiment of the arrangement according to the invention, the non-linear element comprises at least one phase shift circuit. The phase shift circuit is arranged for phase shifting the displacement current relative to the energizing voltage over an angle smaller than 90°. The phase shift circuit may comprise an impedance matching circuit. The phase shift circuit, in its simplest embodiment, may comprise an inductance connected in series between the electrodes and the AC power supply terminals.

The gas or gaseous mixture used in accordance with an embodiment of the invention may comprises at least one of a group comprising Helium, Argon, Nitrogen, Air, Oxygen, Carbon Dioxide, Ammonia and a mixture comprising any of these gasses of the group. It may, in accordance with yet another embodiment, also be a mixture of a noble gas and a chemically active gas, such as a precursor gas for chemical vapour deposition.

The arrangement, in accordance with an embodiment of the invention, comprises AC power supply means arranged for energizing the electrodes with an energizing voltage at a frequency between 1 kHz and 50 MHz.

The apparatus and method according to the present invention can be used, in practise, for a wide variety of applications such as, but not limited to, a device for plasma surface treatment of a substrate, such as surface activation processes, which substrate can be glass, polymer, metal, etc., and for the generation of hydrophilic or hydrophobic surfaces; a plasma device for a chemical vapour deposition process; a plasma device for decomposition of gasses containing volatile organic compounds; a plasma device for removing toxical compounds from the gas phase; a plasma device for surface cleaning purposes such as in the sterilisation or dry cleaning processes.

Those skilled in the art will appreciate that transparent conductive oxides (TCO), for example Tin Oxide, Indium Oxide, Indium Tin Oxide (ITO) coatings deposited by sputtering or atmospheric plasma chemical vapour deposition (APCVD), exhibit a lot of contaminations, such as hydrocarbons or hydroxyl groups, and defects. These contaminations, normally have to be removed by a wet cleaning step. However, it is found that cleaning of these contaminated TCO can be done very effectively using the APG of this invention, as shown in the example below.

BRIEF DESCRIPTION OF THE DRAWINGS

The above-mentioned and other features and advantages of the invention are illustrated in the following description with reference to the enclosed drawings, wherein.

DETAILED DESCRIPTION OF THE DRAWINGS

Figure 1:
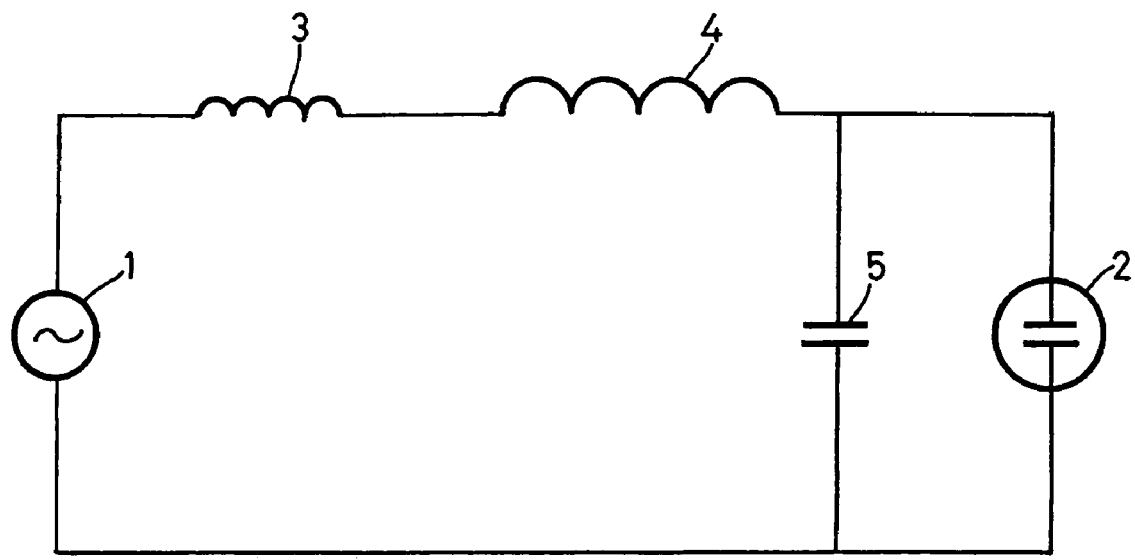
FIG. 1 is a schematic illustration of an arrangement according to an embodiment of the present invention.

FIG. 1 is a schematic illustration of an arrangement according to an embodiment of the present invention, wherein an AC power supply 1 is connected to an electrode configuration 2 forming a discharge space for generating an Atmospheric Pressure Glow (APG) plasma. In series with the electrode configuration 2, there is connected a non-linear electric circuit element in the form of a choke coil 3, which is operated in a saturated state at least during a plasma pulse generated using the AC power supply 1 and in particular in the period of the life cycle of the plasma after its pulse maximum, i.e. at or near the end of the pulse.

In series with the choke coil 3, in accordance with an embodiment of the invention, a further inductor or matching coil 4 is installed which is operated in an unsaturated state. The matching coil 4 is primarily used as phase shifting means, and may be suitably dimensioned for this purpose. In one embodiment, a matching coil having an inductance of 0.7 mH was used together with a ferrite choke coil 3 having an inductance between 0.1 and 0.2 mH. The ferrite used in this choke coil is a 3S4 ferrite (MnZn) with $\mu r=1700$, $Hc=20$ A/m, $Br=170$ A/m and $Bsat=350$ A/m.

A capacitance 5 is parallel connected to the electrode configuration 2 for damping of harmonics. This capacitance 5 may be inherently formed by the stray capacitance of the electrode configuration 2, for example.

The effects of the choke coil 3 may be noted best if the saturation current of the choke coil 3 is at least smaller than the displacement current of the circuit of FIG. 1 without a choke coil 3, which is equal to:

$$I_{d,\,without\_choke} = \omega C V_{max} \tag{2}$$

wherein:
ω=fundamental angular frequency of the AC energizing voltage,
C=capacity of the APG electrode configuration, and
$V_{max}$=amplitude of the AC energizing voltage.

Preferably, the saturation current of the choke coil used is larger than 50% of the displacement current.

Figure 2:
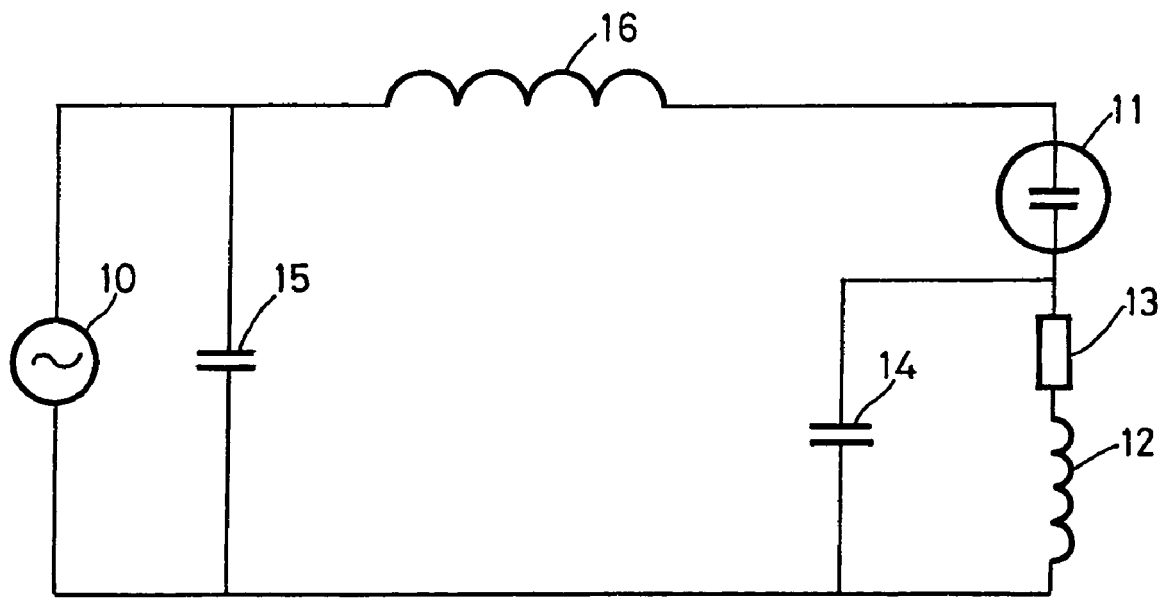
FIG. 2 is another schematic illustration of an arrangement according to an embodiment of the present invention.

FIG. 2 shows another embodiment of the present invention. Here, an AC power supply 10 is connected to an electrode configuration 11. In series with the electrode configuration 11, there is connected a choke coil 12. The capacitor 15 is connected parallel to the electrode configuration 11 and a matching coil 16. A ground wire capacitor 14 is connected in series with the electrode configuration 11 and parallel to the choke coil 12. This ground wire capacitor 14 is arranged for boosting the voltage applied to the choke coil 12, such that choke coil 12 is saturated more easily without affecting power source matching and operation of the circuit. A resistor 13 is connected in series with the choke coil 12. In the embodiment of FIG. 2, the effects of saturation of the choke coil 12 on the potential of the bottom electrode (ground side) of the electrode configuration 11 is considerable. Saturation of the LC circuit consisting of the choke coil 12 and the ground wire capacitor 14 will generate large potential variations.

Figure 3:
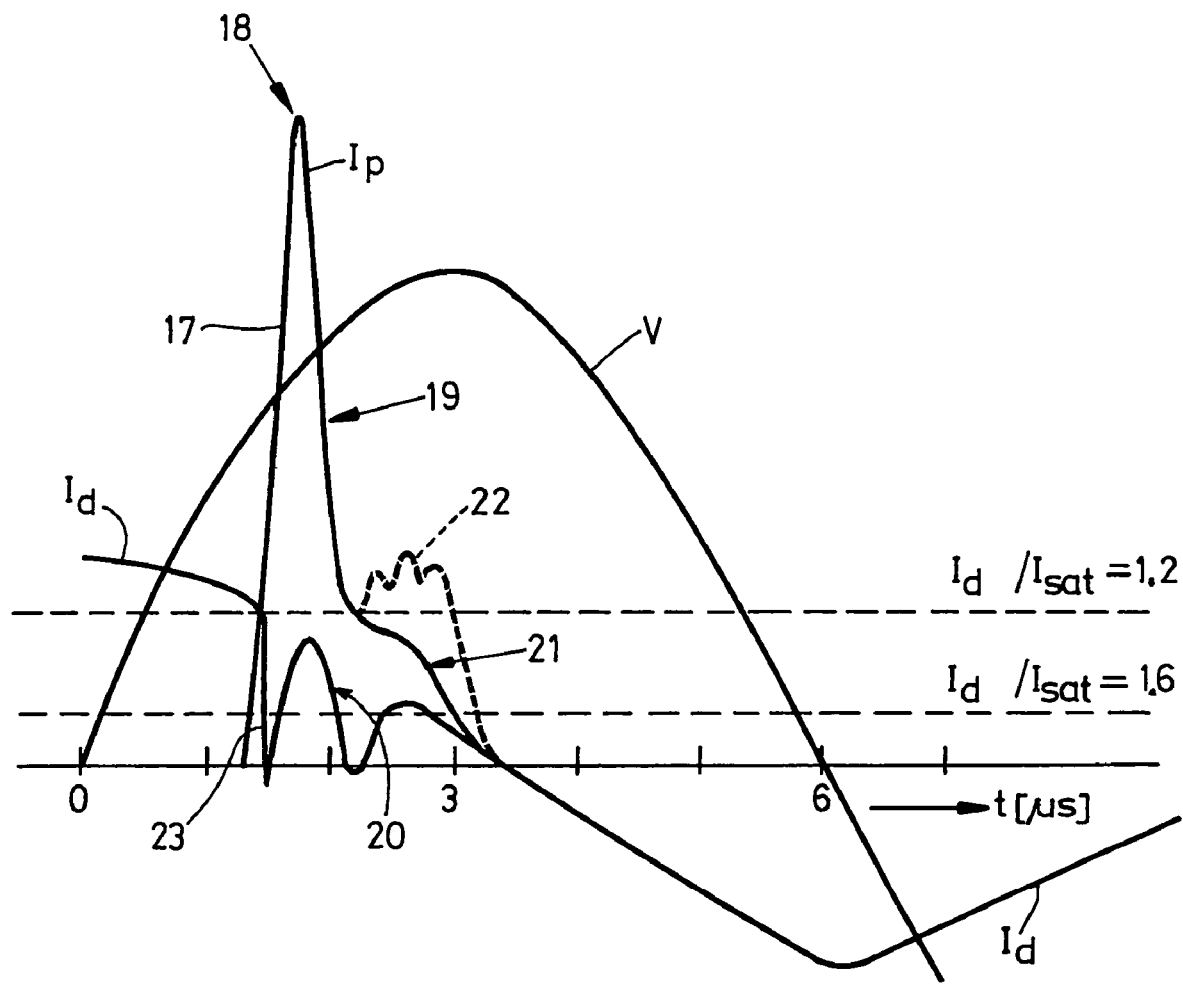
FIG. 3 shows the AC energizing voltage, the plasma current and the displacement current of a plasma generated using an embodiment of the present invention.

FIG. 3 shows a graph of the energizing voltage V, the plasma current $I_p$ and the displacement current $I_d$ over time t, in an embodiment of the method of the present invention with the arrangement shown in FIG. 1. For illustrative purposes, only the positive first halve of the energizing voltage V is shown. A plasma was generated according to the invention under the following conditions: An LC series network at 240 kHz was used with a resonance or matching coil 4 having an inductance of 2 mH, an APG electrode capacitance 5 of 140 pF, a choke coil 3 having an inductance of 0.7 mH, and with $I_d/I_{sat}=1.4$. The gas used was Ar+20% air at atmospheric pressure. To prevent the risk of sparking and for matching reasons a pulsed plasma with a duty cycle of 10% was used.

It can be seen that a plasma pulse 17 is generated having an absolute pulse maximum 18. After the pulse maximum 18, i.e. between time t of approximately 2 and 3 µs, the plasma current $I_p$ decreases, showing a negative slope 19. In accordance with the present invention, in relation to the decrease 19 of the plasma current $I_p$, a relative decrease 20 of the displacement current $I_d$ occurs, caused by the saturated choke 3. As a result, the plasma current $I_p$ shows a relatively clean downward slope 21, without sharp peaks or spikes generated by plasma filaments, providing a stable glow plasma as intended. For illustrative purposes, the broken line 22 illustrates the plasma current $I_p$ in accordance with the prior art, i.e. without the teachings of the invention. One can observe a very irregular current waveform 22, causing unwanted streamers and the like in the plasma.

From FIG. 3 it can be further seen that in the time period at least from just before the plasma breakdown until during the plasma pulse 17 after the pulse maximum 18, the ratio between the displacement current $I_d$ and the saturation current $I_{sat}$ of the choke coil 3 is comprised in a range between 1.2 and 1.6. With this ratio, the displacement current $I_d$ has a substantially triangular shape, except for the regions where the plasma is generated, and shows a relative decrease during the whole of the period from before the start of the plasma pulse 17, after the pulse maximum 18, until the plasma is fully extinguished. This triangular wave form is very beneficial for obtaining a stable plasma breakdown. In general, the stability of the plasma is enhanced by steepening the slope of the displacement current, i.e. $dI_d/dt$.

From FIG. 3 it can also be observed that at the generation of the plasma pulse 17, that is before the pulse maximum 18 the displacement current $I_d$ at first drops considerably, i.e. between time t of approximately 1 and 2 µs, indicated by reference numeral 23. This drop 23 of the displacement current $I_d$ is caused by the (unsaturated) matching coil 4. Accordingly, in the arrangement of the invention, as illustratively shown in FIGS. 1 and 2, amongst others, by properly selecting the choke coil such that ratio between the displacement current $I_d$ and the saturation current $I_{sat}$ of the choke coil 3 is comprised in a range between 1.0 and 3, and preferably between 1.2 and 1.6, in combination with an (unsaturated) matching coil, a sharp relative decrease of the displacement current $I_d$ at the generation of the plasma pulse 17 can be obtained, enhancing and sustaining the generation of a stable glow plasma.

It has been observed that by increasing the ratio between the displacement current $I_d$ and the saturation current $I_{sat}$ of the choke coil 3 beyond 1.6, the voltage over the APG electrodes will show a more rectangular shaped waveform.

From FIG. 3 it will be clear that the relative decrease of the displacement current according to the invention and described above is provided in fractions of a microsecond.

Those skilled in the art will appreciate that similar waveforms of opposite sign will occur at the negative halve period of the energizing voltage V.

Figure 4A:
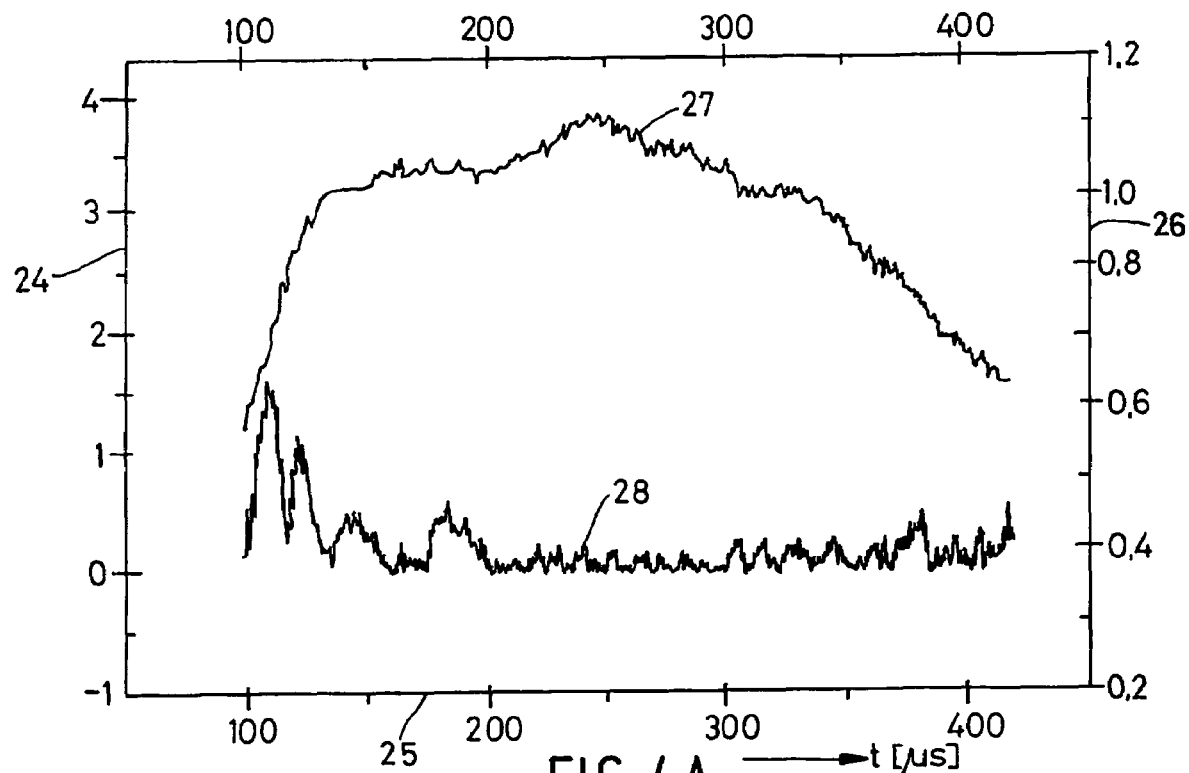
FIG. 4A and FIG. 4B are graphs showing the light intensity distribution over time for a plasma generated using a saturated coil, FIG. 4A, in accordance with the present invention, and without using a saturated coil, FIG. 4B, in accordance with the prior art.
Figure 4B:
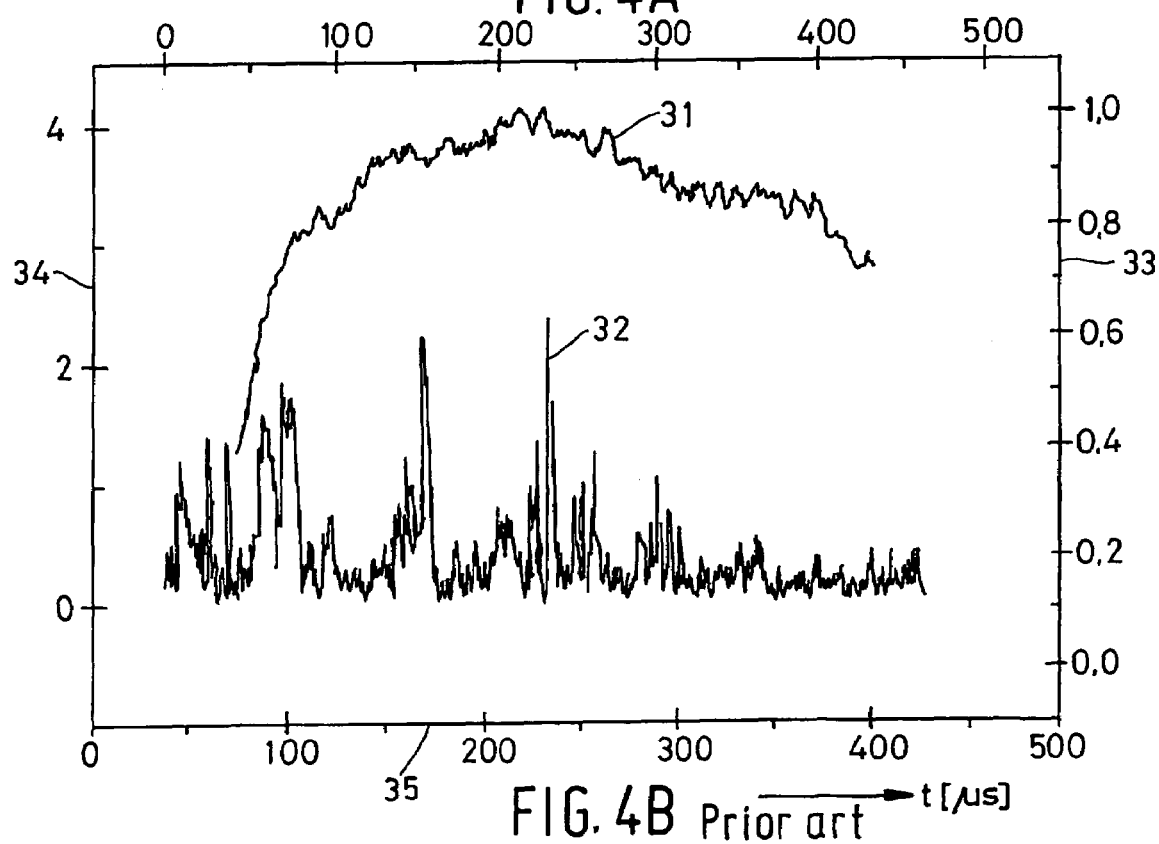

In FIGS. 4A and 4B, the plasma generated using a method according to the present invention, i.e. FIG. 4A, is compared to a plasma generated using a method of the prior art, i.e. FIG. 4B, that is without generation of a relative decrease of displacement current at the end of the plasma pulse. In FIG. 4A, a combination of a saturated choke coil 3 and an unsaturated matching coil 4 is used. The measured light intensity 27 coming from the plasma is plotted over time t, wherein time t is plotted on the horizontal axis 25. The magnitude of the intensity is plotted in arbitrary units on the vertical axis 26 on the right hand side of the graph. The axis 24 on the left side indicates the magnitude of the intensity fluctuation 28 as a percentage of the intensity.

In FIG. 4B, like FIG. 4A, the measured light intensity 31 is plotted and its magnitude is given on the right horizontal axis 33. Again, the intensity fluctuation 32 over time t on the horizontal axis 35 is plotted and its magnitude is given by the left hand vertical axis 34. In both cases, FIG. 4A and FIG. 4B, the plasma was generated with an AC voltage of 60 kHz.

By comparing both FIGS. 4A and 4B, it is clear that by using a saturated coil in accordance with the invention, such as choke coils 3 and 12 of FIGS. 1 and 2, respectively, plasma variations and instabilities can be effectively suppressed.

EXAMPLE (see FIG. 1)

A plasma was generated according to this invention using the following conditions: An LC series network at 240 kHz was used with a resonance or matching coil 4 having an inductance of 2 mH, an APG electrode capacitance 5 of 140 pF, a choke coil 3 having an inductance of 0.7 mH, and with $I_d/I_{sat}=1.4$. The gas used was Ar+20% air at atmospheric pressure. To prevent the risk of sparking and for matching reasons a pulsed plasma with a duty cycle of 10% was used. The processing times used were 5 min to 30 min but due to pulsing the effective plasma exposure time was 0.5 to 3 min. For all the samples a forwarded power of 315 W was delivered by the energizing generator 1. The power density was 1 W/cm².

According to these plasma parameters, a foil sputtered with ITO was treated.

In order to prevent contamination of the samples, mostly glass as a dielectric on the top electrode was used (a dielectric barrier system is used to prevent sparking).

Sample 1: Processing time 16 min. Plasma exposure time 1.6 min. Sample placed on the ground electrode. The high voltage electrode was covered with glass.

Sample 2: Processing time 5 min. Plasma exposure time 0.5 min. Sample placed on ground electrode. The high voltage electrode was covered with glass.

Sample 3: Processing time 10 min. Plasma exposure 1 min. Sample placed on ground electrode. The high voltage electrode was covered with glass.

Sample 4: Processing time 30 min. Plasma exposure 3 min. Sample placed on ground electrode. The high voltage electrode was covered with glass. Due to poor contact of the ITO with the electrode, no plasma was ignited in the centre of the gap, thus in this area the treatment was very weak.

The samples were evaluated judging SEM pictures. For each sample about 8 positions along the foil were examined. The reference (untreated) surface contains a high density of dark spots. The treated surfaces appeared to be completely white even for the shortest exposure time (30 s).

Those skilled in the art will appreciate that many modifications and additions can be made without departing from the novel and inventive scope of the invention as defined in the appending claims.

The invention claimed is:

1. A method for controlling a glow discharge plasma in a gas or gas mixture under atmospheric conditions, in a plasma discharge space comprising at least two spaced electrodes, comprising the steps of generating at least one plasma pulse by applying an AC plasma energizing voltage to the at least two spaced electrodes thereby causing a plasma current and a displacement current, said at least one plasma pulse including an absolute pulse maximum, and controlling the AC plasma energizing voltage such that a relative decrease of the displacement current is provided after the pulse maximum.

2. The method according to claim 1, comprising the further step of synchronizing said relative decrease of said displacement current and said plasma pulse after said absolute pulse maximum.

3. The method according to claim 1, wherein said displacement current is controlled by controlling said plasma energizing voltage.

4. The method according to claim 3, wherein said relative decrease of said displacement current is provided by a relative decrease of said plasma energizing voltage.

5. The method according to claim 3, wherein said energizing voltage is shaped, such that said displacement current substantially comprises a triangular waveform.

6. The method according to claim 3, wherein said plasma energizing voltage is applied at said electrodes via at least one non-linear element.

7. The method according to claim 6, wherein said non-linear element comprises at least one choke coil.

8. The method according to claim 7, wherein said at least one choke coil is in a saturated state during said plasma pulse after said pulse maximum.

9. The method according to claim 8, wherein said relative decrease of said displacement current is provided by operating said choke coil such that the inductance of said choke coil behaves non-linear with respect to said plasma current.

10. The method according to claim 7 wherein said choke coil comprises a saturation current for which said choke coil becomes saturated when an electric current through said choke coil exceeds said saturation current, and wherein the ration between said displacement current and said saturation current is comprised in a range between 1.0 and 3.0 during said plasma pulse after said pulse maximum.

11. The method according to claim 10, wherein the ration between said displacement current and said saturation current is comprised in a range between 1.2 and 1.6 during said plasma pulse after said pulse maximum.

12. The method according to claim 6, wherein said non-linear element further comprises a phase shift circuit.

13. The method according to claim 12, wherein said phase shift circuit is arranged for phase shifting said displacement current relative to said energizing voltage over an angle smaller than 90°.

14. Use of a method according to claim 1 for performing chemical vapour deposition, surface cleaning, surface modification and the like.

15. Use according to claim 1, wherein the surface for surface cleaning is the surface of a transparent conductive oxide layer applied onto a substrate.

16. Use according to claim 15, wherein the transparent oxide layer is a tin oxide, an indium oxide or an indium tin oxide.

17. Method according to claim 4, wherein said energizing voltage is shaped, such that said displacement current substantially comprises a triangular waveform.

18. Method according to claim 4, wherein said plasma energizing voltage is applied at said electrodes via at least one non-linear element.

19. Method according to claim 5, wherein said plasma energizing voltage is applied at said electrodes via at least one non-linear element.

20. Method according to claim 8, wherein said choke coil comprises a saturation current for which said choke coil becomes saturated when an electric current through said choke coil exceeds said saturation current, and wherein the ration between said displacement current and said saturation current is comprised in a range between 1.0 and 3.0 during said plasma pulse after said pulse maximum.

21. Method according to claim 9, wherein said choke coil comprises a saturation current for which said choke coil becomes saturated when an electric current through said choke coil exceeds said saturation current, and wherein the ration between said displacement current and said saturation current is comprised in a range between 1.0 and 3.0 during said plasma pulse after said pulse maximum.

22. A system for controlling a glow discharge plasma in a discharge space having at least two spaced apart electrodes, comprising a gas inlet assembly introducing in said discharge space a gas or gaseous mixture under atmospheric conditions, a power supply for energizing said electrodes by applying an AC plasma energizing voltage to said electrodes for generating at least one plasma pulse and causing a plasma current and a displacement current, said at least one plasma pulse comprising an absolute pulse maximum, and means for controlling said plasma, wherein said means for controlling said plasma are arranged for controlling said AC plasma energizing voltage such that a relative decrease of said displacement current is provided after said absolute pulse maximum.

23. The system according to claim 22, further comprising a circuit for synchronizing said relative decrease of said displacement current and said plasma pulse after said absolute pulse maximum.

24. The system according to claim 22, wherein said means for controlling said plasma are arranged for controlling said displacement current by controlling said plasma energizing voltage.

25. The system according to claim 24, wherein said means for controlling said plasma are arranged for providing said relative decrease of said displacement current by providing a relative decrease of said plasma energizing voltage.

26. The system according to claim 24, wherein said means for controlling said plasma are arranged for shaping said AC plasma energizing voltage.

27. The system according to claim 26, wherein said means for controlling said plasma are arranged for shaping said AC plasma energizing voltage such that said displacement current substantially comprises a triangular waveform.

28. The system according to claim 25, wherein said means for controlling said plasma comprises at least one non-linear element.

29. The system according to claim 28, wherein said at least one non-linear element comprises at least one choke coil.

30. The system according to claim 28, wherein said at least one non-linear element is connected in series between said electrodes and AC power supply terminals.

31. The system according to claim 28, wherein said non-linear element comprises at least one phase shift circuit.

32. The system according to claim 31, wherein said phase shift circuit comprises an impedance matching circuit.

33. The system according to claim 31, wherein said phase shift circuit comprises an inductance connected in series between said electrodes and AC power supply terminals.

34. The system according to claim 22, wherein said gas or gaseous mixture comprises at least one of a group comprising Helium, Argon, Nitrogen, Air, Oxygen, Carbon Dioxide, Ammonia and a mixture comprising any of said gasses of said group.

35. The system according to claim 22, wherein said gas is a mixture of a noble gas and a chemically active gas.

36. The system according to claim 35, wherein said chemically active gas is a precursor gas for chemical vapour deposition.

37. The system according to claim 22, further comprising an AC power supply energizing said electrodes with an energizing voltage at a frequency between 1 kHz and 50 MHz.

38. Arrangement according to claim 23, wherein said means for controlling said plasma are arranged for controlling said displacement current by controlling said plasma energizing voltage.

39. Arrangement according to claim 25, wherein said means for controlling said plasma are arranged for shaping said plasma energizing voltage.

40. Arrangement according to claim 26, wherein said means for controlling said plasma comprises at least one non-linear element.

41. Arrangement according to claim 27, wherein said means for controlling said plasma comprises at least one non-linear element.

42. Arrangement according to claim 29, wherein said at least one non-linear element is connected in series between said electrodes and AC power supply terminals.

43. Arrangement according to claim 29, wherein said non-linear element comprises at least one phase shift circuit.

44. Arrangement according to claim 30, wherein said non-linear element comprises at least one phase shift circuit.

* * * * *